United States Patent
Varnica et al.

(10) Patent No.: US 9,160,373 B1
(45) Date of Patent: Oct. 13, 2015

(54) SYSTEMS AND METHODS FOR JOINT DECODING OF SECTOR AND TRACK ERROR CORRECTION CODES

(71) Applicant: Marvell International Ltd., Hamilton (BM)

(72) Inventors: Nedeljko Varnica, San Jose, CA (US); Gregory Burd, San Jose, CA (US); Panu Chaichanavong, Bangkok (TH)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/031,527

(22) Filed: Sep. 19, 2013

Related U.S. Application Data (60) Provisional application No. 61/704,919, filed on Sep. 24, 2012, provisional application No. 61/704,897, filed on Sep. 24, 2012.

(51) Int. Cl.
| | |
|---|---|
| *H03M 13/29* | (2006.01) |
| *H03M 13/53* | (2006.01) |
| *H03M 13/45* | (2006.01) |
| *H04L 1/00* | (2006.01) |
| *H03M 13/43* | (2006.01) |

(52) U.S. Cl.
CPC ...... *H03M 13/2909* (2013.01); *H03M 13/2957* (2013.01); *H03M 13/43* (2013.01); *H03M 13/45* (2013.01); *H04L 1/0057* (2013.01)

(58) Field of Classification Search
CPC . H03M 13/2957; H03M 13/43; H03M 13/29; H03M 13/2909; H03M 13/45; H04L 1/0009; H04L 1/0057; H04L 1/0045; G11B 20/1833; G06F 11/1076; G06F 11/1008
See application file for complete search history.

(56) References Cited

U.S. PATENT DOCUMENTS

| | | | |
|---|---|---|---|
| 5,703,887 A * | 12/1997 | Heegard et al. | 714/775 |
| 5,832,310 A * | 11/1998 | Morrissey et al. | 710/71 |
| 6,185,063 B1 | 2/2001 | Cameron | |
| 6,442,705 B1 | 8/2002 | Lamberts | |
| 6,549,362 B1 | 4/2003 | Melrose et al. | |
| 6,697,209 B2 | 2/2004 | Hughes et al. | |
| 6,724,702 B2 | 4/2004 | Taguchi et al. | |
| 6,862,155 B2 | 3/2005 | Yang et al. | |
| 6,963,528 B2 | 11/2005 | Ogura | |
| 7,082,007 B2 | 7/2006 | Liu et al. | |
| 7,126,890 B2 | 10/2006 | Learned et al. | |
| 7,209,305 B2 | 4/2007 | Chan et al. | |
| 7,218,665 B2 | 5/2007 | McElwain | |
| 7,356,752 B2 | 4/2008 | Hewitt et al. | |
| 7,423,828 B2 | 9/2008 | Emo et al. | |
| 7,457,075 B2 | 11/2008 | Liu et al. | |
| 7,567,397 B2 | 7/2009 | Lu | |
| 7,768,729 B2 | 8/2010 | Moser et al. | |
| 7,965,465 B2 | 6/2011 | Sanvido et al. | |

(Continued)

*Primary Examiner* — April Y Blair
*Assistant Examiner* — Dipakkumar Gandhi (57) ABSTRACT

Systems and methods are provided for decoding data stored on a storage device. A decoding method is described for retrieving data from the storage device, wherein the retrieved data are encoded using a product code having a first dimension and a second dimension. The decoding method includes processing at least one codeword from the first dimension to form detector soft information, decoding the at least one codeword from the first dimension based on the detector soft information to form a first decoder soft information, and decoding at least one codeword from the second dimension based on the first decoder soft information to form a second decoder soft information.

16 Claims, 9 Drawing Sheets

(56) References Cited

U.S. PATENT DOCUMENTS

| | | |
|---|---|---|
| 7,982,994 B1 * | 7/2011 | Erden et al. .................. 360/55 |
| 8,014,097 B1 | 9/2011 | Sanvido |
| 8,125,723 B1 | 2/2012 | Nichols et al. |
| 8,139,301 B1 | 3/2012 | Li et al. |
| 8,259,409 B2 | 9/2012 | Braganca et al. |
| 8,300,339 B1 | 10/2012 | Nangare et al. |
| 8,441,750 B1 | 5/2013 | Nangare et al. |
| 8,599,508 B1 | 12/2013 | Burd |
| 8,625,215 B1 | 1/2014 | Burd et al. |
| 8,638,513 B1 | 1/2014 | Burd |
| 8,638,522 B2 | 1/2014 | Matsuo et al. |
| 8,837,074 B1 | 9/2014 | Burd et al. |
| 2001/0052104 A1 * | 12/2001 | Xu et al. ...................... 714/792 |
| 2003/0033570 A1 | 2/2003 | Khannanov et al. |
| 2003/0218955 A1 | 11/2003 | Isshiki et al. |
| 2006/0179400 A1 | 8/2006 | Qian et al. |
| 2007/0074083 A1 | 3/2007 | Olds et al. |
| 2007/0177292 A1 | 8/2007 | Bui et al. |
| 2007/0192666 A1 * | 8/2007 | Song et al. .................. 714/780 |
| 2008/0055122 A1 * | 3/2008 | Tan .............................. 341/52 |
| 2008/0151704 A1 | 6/2008 | Harada |
| 2008/0174905 A1 | 7/2008 | Ueda |
| 2008/0244356 A1 | 10/2008 | Bliss et al. |
| 2008/0244359 A1 * | 10/2008 | Li et al. ...................... 714/758 |
| 2010/0218066 A1 | 8/2010 | Okamura et al. |
| 2011/0209026 A1 | 8/2011 | Xia et al. |
| 2012/0060073 A1 | 3/2012 | Itakura et al. |

* cited by examiner

SYSTEMS AND METHODS FOR JOINT DECODING OF SECTOR AND TRACK ERROR CORRECTION CODES

CROSS REFERENCE TO RELATED APPLICATIONS

This disclosure claims the benefit under 35 U.S.C. §119(e) of U.S. Provisional Application No. 61/704,919, filed on Sep. 24, 2012, and U.S. Provisional Application No. 61/704,897, filed on Sep. 24, 2012, the contents of which are each incorporated herein by reference in its entirety.

FIELD OF USE

This disclosure relates generally to data decoding, and more particularly iterative joint decoding of a product code.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the present disclosure.

A traditional recording system stores data to a hard disk drive (HDD) on multiple tracks that each have guard bands on either side of the track to help prevent unintentional overwriting of the data. Each track is further divided into randomly accessible sectors, which are protected by sector-level error correction codes.

In shingled magnetic recording (SMR), the track pitch is made arbitrarily small, and guard bands are reduced or removed to increase track density. In particular, in SMR, data are stored on partially overlapping tracks that interfere with one another. Accordingly, in such systems data must be written to the HDD on a track-by-track basis. That is, writing data to only a specific sector of a given track of the HDD requires rewriting a given track or a band of sequentially overlapping tracks in its entirety.

Furthermore, in an HDD, different codewords or sectors often experience different noise characteristics or different noise realizations, even if the statistical properties of the noise is the same across the HDD. Thus, some portions of a track may be more prone to errors while other portions are less prone to errors.

SUMMARY

In accordance with some implementations of the disclosure, systems and methods are provided for decoding data stored on a storage device. A decoding method is described for retrieving data from the storage device, wherein the retrieved data are encoded using a product code having a first dimension and a second dimension. The decoding method comprise processing at least one codeword from the first dimension to form detector soft information, decoding the at least one codeword based on the detector soft information to form a first decoder soft information, and decoding at least one codeword from the second dimension based on the first decoder soft information to form a second decoder soft information. In one implementation, processing the first codewords comprises performing finite impulse response (FIR) filtering operations. In one implementation, the storage device is a magnetic storage device. The retrieved data may be written to one of a plurality of tracks using a shingled technique, and the data may be retrieved from a plurality of sectors of the storage device.

In accordance with some implementations of the disclosure, detector soft information, the first decoder soft information, or the second decoder soft information are further updated. In one example, the first decoder soft information is updated based on the second decoder soft information. In one example, the second decoder soft information is updated based on the detector soft information. In one example, the detector soft information is updated based on the second decoder soft information. In one example, the detector soft information is updated in response to determining that target syndrome weight of one of the at least one codeword from the second dimension exceeds a predetermined threshold.

In accordance with some implementations of the disclosure, a decoder is described for decoding data stored on a storage device. The decoder comprises circuitry configured to retrieve data from the storage device, wherein the retrieved data are encoded using a product code having a first dimension and a second dimension. The circuitry is further configured to process at least one codeword from the first dimension to form detector soft information, to decode the at least one codeword from the first dimension based on the detector soft information to form a first decoder soft information, and to decode at least one codeword from the second dimension based on the first decoder soft information to form a second decoder soft information. In one implementation, the circuitry is configured to process the at least one codeword from the first dimension by performing finite impulse response (FIR) filtering operations. In one implementation, the storage device is a magnetic storage device. In one implementation, the retrieved data may be written to one of a plurality of tracks using a shingled technique. In one implementation, the data may be retrieved from a plurality of sectors of the storage device.

In accordance with some implementations of the disclosure, the circuitry is further configured to update the detector soft information, the first decoder soft information, or the second decoder soft information. In one example, the circuitry is further configured to update the first decoder soft information based on the second decoder soft information. In one example, the circuitry is further configured to update the second decoder soft information based on the detector soft information. In one example, the circuitry is further configured to update the detector soft information based on the second decoder soft information. In one example, the circuitry is further configured to update the detector soft information in response to determining that target syndrome weight of one of the at least one codeword from the second dimension exceeds a predetermined threshold.

BRIEF DESCRIPTION OF THE DRAWINGS

The above and other features of the present disclosure, including its nature and its various advantages, will be more apparent upon consideration of the following detailed description, taken in conjunction with the accompanying drawings in which.

DETAILED DESCRIPTION

This disclosure generally relates to product codes, and in particular, for performing joint sector and track level decoding for non-volatile storage systems. As described herein, methods and systems are provided for reading and decoding data that have been recorded in an arrangement of tracks on a storage medium. In particular, the methods and systems described herein involve joint decoding of sector-level and track-level error correction codes. For illustrative purposes, this disclosure is described in the context of a magnetic storage device. It should be understood, however, that this disclosure is applicable to any other type of non-volatile storage device where data are stored in tracks that have multiple sectors (e.g., a magnetic storage device, magneto-resistive random access memory (MRAM), optical storage device, domain propagation storage device, and a holographic storage device).

In traditional recording, data are stored on an HDD in individual tracks with guard bands on either side of the track to help prevent unintentional data overwrite. Each track is further divided into randomly accessible sectors protected by sector-level error correction codes. In shingled magnetic recording (SMR), data are stored in partially overlapping tracks that interfere with each other. Accordingly, in SMR, data must be written to the HDD on a track-by-track basis. That is, writing data to only a specific sector of a given track of the HDD requires rewriting a given track or a band of sequentially overlapping tracks in its entirety. Systems and methods for reading and writing data to non-volatile storage device in a shingled manner are discussed in more detail in: Gregory Burd U.S. patent application Ser. No. 13/082,018, filed Apr. 7, 2011; Burd et al. U.S. patent application Ser. No. 13/050,315, filed Mar. 17, 2011; Gregory Burd et al. U.S. patent application Ser. No. 13/372,759, filed Feb. 14, 2012; and Burd et al. U.S. patent application Ser. No. 13/413,049, filed Mar. 6, 2012, each of which is hereby incorporated by reference herein in its entirety.

When data are written on a track-by-track basis, track-level coding can be used in addition to sector-level coding to further provide error correction capabilities, especially when noise characteristics vary from sector to sector. In particular, a product code may be used to implement track-level coding in addition to sector-level coding. As used herein, the phrase "track-level" coding means performing an encoding or decoding operation (encoding or decoding data) across multiple consecutive or non-consecutive sectors of a given track or a given track band. Track level encoding systems and methods are described in Varnica et al. U.S. patent application Ser. No. 14/031,277, filed Sep. 19, 2013, which is hereby incorporated by reference herein in its entirety.

Figure 1:
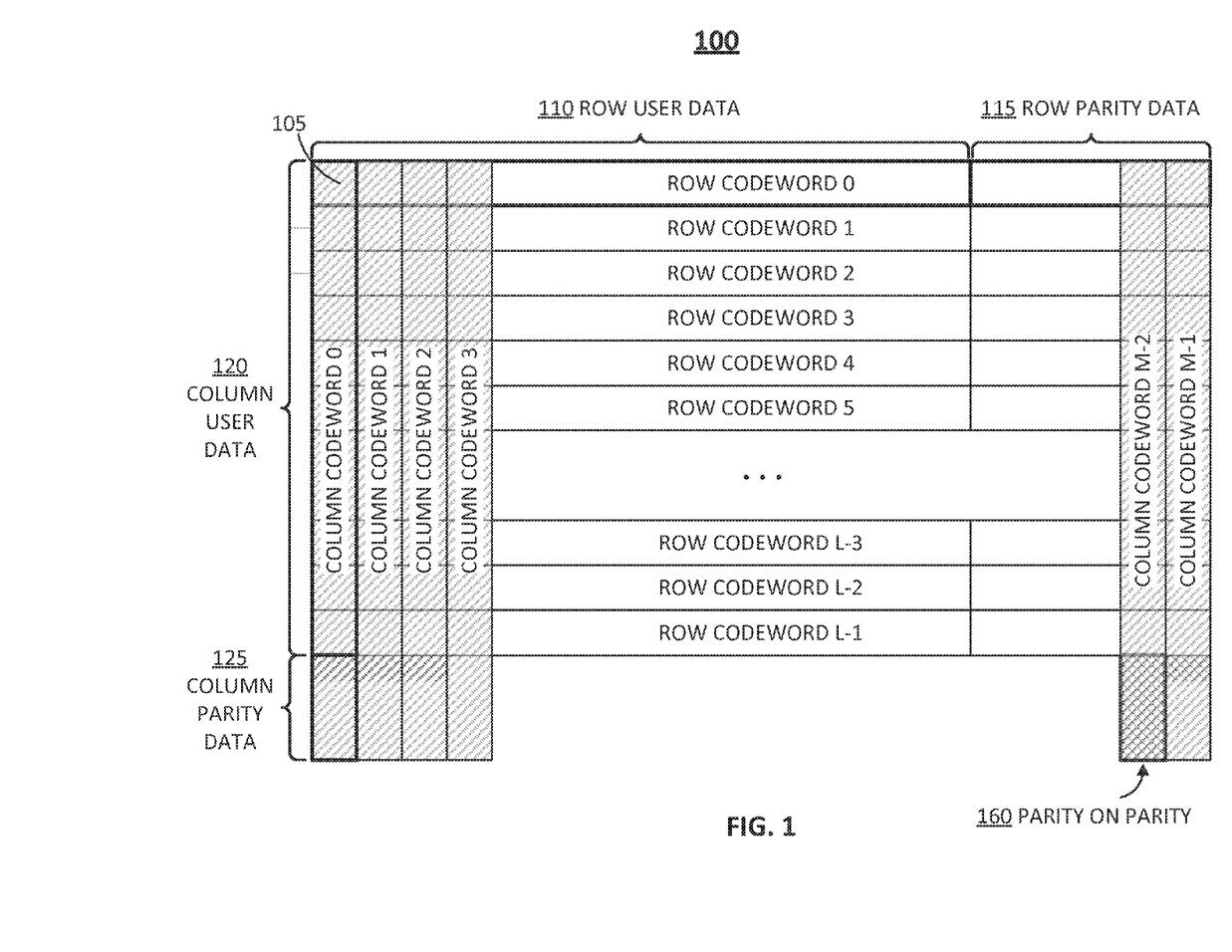
FIG. 1 shows a diagram of an illustrative product code, in accordance with an embodiment of the present disclosure.

FIG. 1 shows a diagram 100 of an illustrative product error correction code for data encoding in accordance with an embodiment of the present disclosure. The row parity data 115 are computed from the row user data 110 for each row codeword, while the column parity data 125 are computed from the column user data 120 for each column codeword. In addition, column encoding is applied to row parity data 115 to form column parities 160, which are "parity-on-parity". Parity-on-parity data 160 may be optional in some embodiments, when column encoding is applied to row user data 110 only. As discussed above, the product code shown in FIG. 1 may be applied to data written to an HDD. User data to be written to the HDD may be first received and buffered, before being passed through a product code encoder. The product code encoder processes the user data to generate encoded data, which is then written sequentially into the HDD.

In the illustrative example shown in FIG. 1, the product code is two dimensional, and includes a row code and a column code. As is described herein for illustrative purposes only, the row code is the code operating in the direction of the user data as the data are sequentially read or written, while the column code operates on the interleaved user data. However, one of ordinary skill in the art will understand that the systems and methods described herein may also apply to a column code that operates in the direction of the user data as they are being sequentially read or written, and the row code operates on the interleaved user data, without departing from the scope of the present disclosure.

The row code and the column code in the product code shown in FIG. 1 are error correction codes, and may correspond to the same or different codes. In one example, the row code is a low density parity check (LDPC) code that generates parity data from long strings of user data, while the column code is a BCH or RS code. In another example, both the row code and the column code are LDPC codes, with the same or different rates and generator matrices. When both row and column codes are LDPC codes, the same hardware may be used to implement the encoding or decoding of both sets of codes, thus reducing power use and storage space. In some embodiments, encoding and decoding circuitries for the row and column codes are programmable, to support different code rates that may be selected according to read channel noise characteristics. In addition, in various embodiments, the row code and the column code may be binary or non-binary, where each symbol 105 of a codeword may represent the element of a binary field or a non-binary finite field of a given size.

In the example shown in FIG. 1, row encoding is performed before column encoding, where row code is the code operating in the direction of the user data as the data are sequentially read or written, while the column code operates on the interleaved user data. Row parity data 115 are generated from row user data 110, and are concatenated to row user data 110 to form individual row codewords. Similarly, column parity data 125 are generated from column user data 120, and are concatenated to column user data 120 to form individual column codewords. Optionally (and as shown in FIG. 1), parity-on-parity data 160 may be computed as the column parities of row parity data 115. In this example, the product code corresponds to data written to a track of an HDD, where each row codeword is written into a sector of an HDD, with row parity data 115 being sector-level parities. Thus, for L row codewords (labeled ROW CODEWORDs 0 to L−1), a total of L sectors are written onto a track or a partial track. Column code parity data 125 and optionally parity-on-parity data 160, both track-level parities, may be written onto the track after the row codewords. Thus, in this example, sector-level error correction coding is applied before track-level error correction coding. Typical sector sizes are 512 bytes or 4 KB but in general may be any suitable size.

When row parity data 115 and column parity data 125 are independently generated from user data, a product code encoder may include a column encoder and a row encoder implemented in hardware that run simultaneously in parallel to generate the product code. Alternatively, row parity data 115 and column parity data 125 may be generated partially and progressively as incoming data arrive, where parity symbols may be generated and buffered.

In some embodiments, the column code is generated before the row code, where column parity data 125 is encoded with the row code to generate parity-on-parity data 160. In some embodiments, a run-length modulation code may be further applied. Depending on the rate of the row code and the rate of the column code, the total amount of column code parity data 125 for all column codewords might not necessarily be an integer multiple of the size of one row codeword. In some embodiments, row parity data 115 or column parity data 125 may be punctured to achieve higher code rates. In addition, if the column code has a much shorter codeword length than the row code does, and if each column codeword is written into a sector, the number of row codewords in the product code may be substantially smaller than size of the track. For example, L may be 16, 32, or 64, while the total number of column codewords may be 300.

To read track and sector-level product code protected data previously written to a non-volatile storage device such as an HDD, a control circuitry may configure a read-head to obtain a read-back signal, where sectors including user data and sector-level parities are sequentially read before track-level parities are read. Such a front end analog read-back signal may be processed by analog and digital read-channel processing circuitries to obtain digitized bit samples and soft information indicative of the reliability of each detected bit. For example, the soft information may be finite impulse response (FIR) samples. With binary codes, soft information may also be represented as a Log Likelihood Ratio (LLR), which is the natural logarithm of the ratio of the probability that a bit is a 1 to the probability that the bit is a 0. Thus, the sign of the LLR values may represent the best estimate of the detected binary sequence, and can be considered hard decisions for the detected sequence. For example, the corresponding hard decision for a positive LLR value may be 1, while the corresponding hard decision for a negative LLR value may be 0.

In some embodiments, the read-signal is processed through a channel detector that tracks and modifies the soft-information based on a message-passing algorithm. In an example, the channel detector may be a Soft-Output Viterbi (SOVA) Decoder that exchanges and updates soft information between adjacent or nearby bits or symbols in each codeword in the digitized read-signal. In particular, the SOVA decoder may include a non-linear Viterbi detector.

Figure 2:
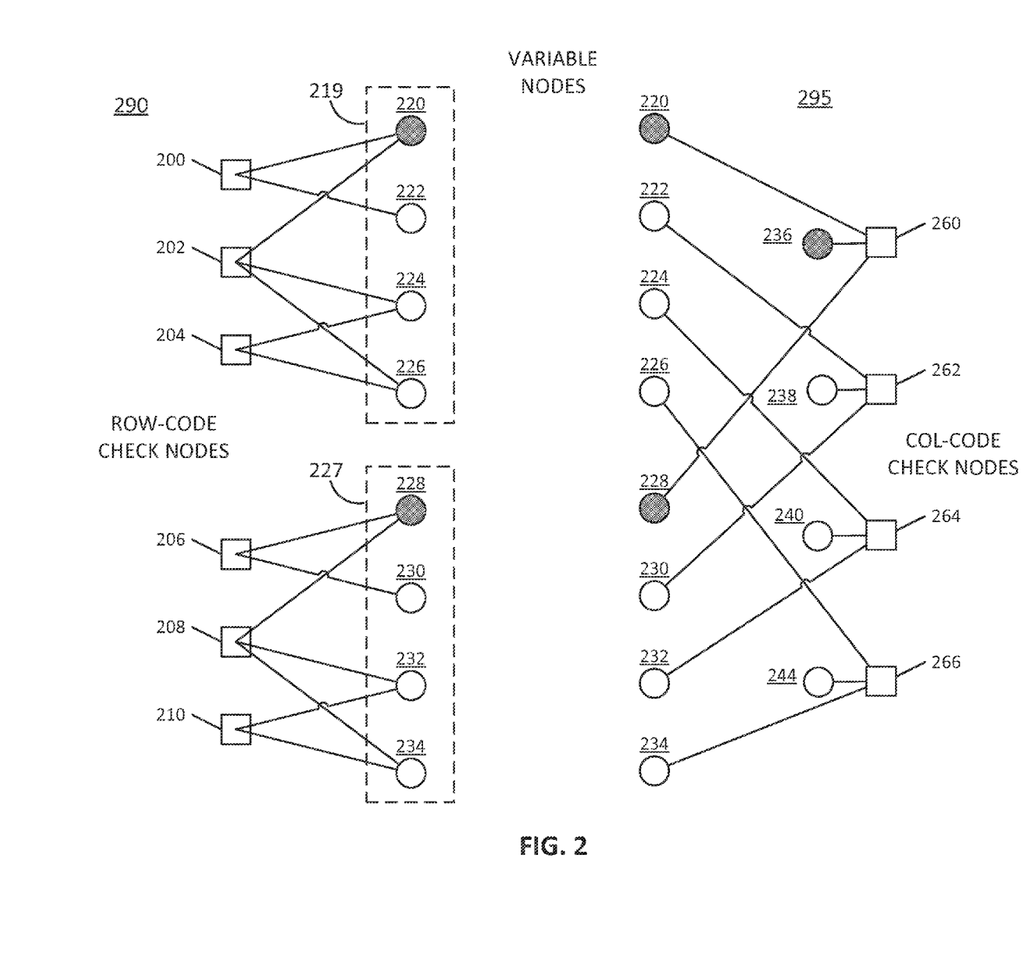
FIG. 2 shows an illustrative Tanner graph for generating and decoding a product code, in accordance with an embodiment of the present disclosure.

In some embodiments, row and column code decoders for the product code illustrated by FIG. 1 update symbol-wise soft information until the user data has been decoded successfully. As an example, FIG. 2 shows Tanner graphs 290 and 295 of the row and column codes of a product code, in accordance with one embodiment of the present disclosure. A Tanner graph is a bipartite graph that illustrates the parity check constraints for a block code such as an LDPC code. One advantage of using a Tanner graph representation is the use of efficient graph-based message-passing algorithms for decoding. There are two types of nodes shown in Tanner graphs 290 and 295. Each of the variable nodes 220-234, denoted by circles, represents a symbol (e.g., a bit for a binary code) in the row codewords 219 and 227. For example, variable node 220 may correspond to the data symbol 105 shown in FIG. 1, while the exemplary codewords 219 and 227 may correspond to ROW CODEWORD 0 and ROW CODEWORD 1, respectively. Check nodes 200-204 and 206-210 are denoted by squares and represent syndromes or parity check equations that successfully decoded row codewords must satisfy. Similarly, in Tanner graph 295, variable nodes 220-244 represent four exemplary column codewords, each communicating with a set of check nodes for decoding the column code. For example, the shaded variable nodes 220, 228 and 236 may correspond to COLUMN CODEWORD 0 shown in FIG. 1. In another example, the variable nodes 222, 230, and 238 may correspond to COLUMN CODEWORD 1, the variable nodes 224, 232, and 240 may correspond to COLUMN CODEWORD 2, and the variable nodes 226, 234, and 244 may correspond to COLUMN CODEWORD 3.

The Tanner graphs 290 and 295 may be used for typical iterative decoding of the row code and the column code respectively, where local iterative message passing steps may be carried out between the variable nodes and the check nodes shown in 290 for the row code, and between the variable nodes and the check nodes shown in 295 for the column code. Each local message-passing iteration involves a symbol-to-check step, and a check-to-symbol step for updating the LLR value associated with each symbol as an extrinsic and/or an a-posteriori probability, given the LLR value associated with other symbols related to the symbol under consideration through check nodes. A result of the check-to-symbol step is a set of extrinsic soft information, which identifies symbol reliability values that are determined by redundancies introduced by the code.

After a number of local message-passing iterations, one or more hard decisions may be made on each symbol, and the result may be used to compute the syndrome of the detected symbol sequence. This syndrome or syndrome vector is a set of parity values computed according to variable-to-check relationships represented by the tanner graph. In general, a detected sequence of symbols is a valid codeword if and only if its syndrome is a zero vector. In addition, syndrome vectors may be associated with cosets such that even when the syndrome is not a zero vector, it may be used to identify an error sequence and thus be used for coset-based decoding. Syndrome computation is discussed in more detail in relation to FIG. 6.

In addition, since the variable nodes 220-234 correspond to data and row code parity symbols that are further encoded by the column code to generate column parity symbols represented by variable nodes 236-244, global iterative message passing processes may be carried out between the row code and the column code. The row code decoder may consider the soft information or the LLR values for a set of symbols and row parities (e.g. represented by variable nodes for symbols in a row codeword) related by parity check conditions (e.g., represented by row check nodes), and generates update values or extrinsic information that can be used by a column code decoder to further refine the soft information associated with symbols in column codewords. For example, soft information associated with variable node 220 may be computed through local message-passing iterations according to Tanner graph 290 from soft information associated with variable nodes 222, 224, and 226. The resulting extrinsic information associated with node 220 may be used to update soft information associated with node 228, which is related to variable node 220 through check node 260.

As used herein, the terms "row-decoding" and "column-decoding" refer to any number of internal or local iterations within a row decoder or a column decoder to update and output extrinsic soft information corresponding to one or more symbols within one or more codewords under consideration. In addition, "channel-detection" refers to any number of internal operations within a channel detector using a Soft Output Viterbi Algorithm (SOVA) to 37919654_1 update and output extrinsic soft information corresponding to one or more symbols within one or more codewords under consideration. Moreover, global joint decoding iterations may be performed over any two or all of row-decoding, column-decoding, and channel-detection in any order so that soft extrinsic information from one block can be provided to another to improve the decoding process. For example, as discussed in relation to FIG. 2, in joint decoding between the row code and the column code, extrinsic information for each variable node may be stored and passed from a row-decoder unit to a column-decoder unit and vice versa. Soft information passed from one unit to another may correspond to full codewords or partial codewords, as will be discussed in more detail in relation to FIG. 5. With joint decoding, even if the decoding process fails in one dimension, soft output information can still be used by a decoder in another dimension, or by a channel detector. In addition, by passing extrinsic information corresponding to only partial codewords from one decoder to another, decoding performance may be improved without significant increase in the amount of required storage.

Figure 3:
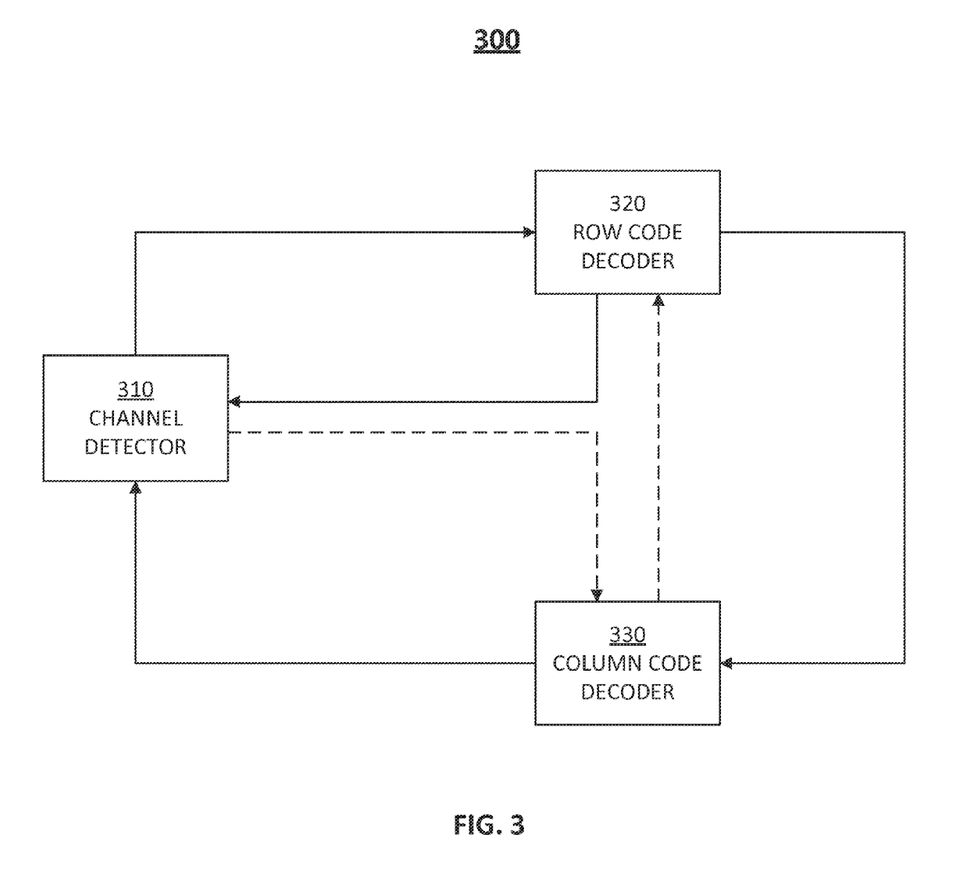
FIGS. 3 and 4 show block diagrams of illustrative iterative decoders, in accordance with some embodiments of the present disclosure.

FIG. 3 shows a block diagram for a joint product code decoder 300 comprising a channel detector 310, a row code decoder 320, and a column code decoder 330. Channel detector 310 may be a SOVA detector or a variation of a SOVA detector, and may implement the channel detection process as described herein to provide channel extrinsic information for the row decoder 320 or the column decoder 330. Row code decoder 320 and column code decoder 330 may implement row-decoding and column-decoding processes as described herein, and one or both of row code decoder 320 and column code decoder 330 may provide extrinsic soft information corresponding to one or more symbols within one or more codewords under consideration to one or both of the other blocks within the joint product code decoder 300. In addition, one or both row code decoder 320 and column code decoder 330 may be hard decoders. When the row code and column code are the same type of code (such as when both codes are LDPC codes, for example), row coder decoder 320 and column code decoder 330 may share the same hardware during implementation, although they are shown as separate entities in FIG. 3 for illustration purposes.

In various embodiments, the joint product code decoder 300 may initiate the decoding process from the channel detector 310, followed by either row code decoder 320 or column code decoder 330. A control circuitry (not shown) may configure the system to provide finite impulse response (FIR) samples to the channel detector 310 and to the block where the joint product code decoding process continues after the detector block 310.

In one embodiment, joint decoding of the product code is initiated at the channel detector 310, and includes performing iterations at both the row code decoder 320 and the column code decoder 330. For example, FIR samples corresponding to all of the row codewords in the product code may be sequentially processed by the channel detector 310 first, before the FIR samples and extrinsic information are transmitted to the row code decoder 320. The row code decoder may perform hard decoding or local message passing iterations of soft decoding on one or more row codewords. In an example, a fixed number of message-passing iterations may be performed by the row code decoder 320 on each row codeword before a hard decision is made on the row codeword, and a syndrome computation operation is performed to identify whether a valid row codeword was decoded. Soft information corresponding to failed row codewords are then transferred to the column code decoder 330, which attempts to decode one or more column codewords, based at least partially on soft information received from row code decoder 320. In addition, symbols from successfully decoded row codewords may be used to partially compute column syndrome vectors, thereby "pruning" the associated Tanner graph to reduce the total amount of storage and computation needed for joint decoding.

In both the row code decoder 320 and the column code decoder 330, the number of local message passing iterations may be pre-defined or programmable, based on read channel noise characteristics, one or more syndrome weight thresholds, or other relevant system parameters. For example, local message-passing decoding operations may repeat at row code decoder 320 for a given row codeword, until a syndrome computed for the decoded symbol sequence has a weight less than a pre-defined threshold.

Once one or more column codewords are decoded by column code decoder 330, soft information corresponding to failed column codewords may be transferred from the column code decoder 330 to the channel detector 310, to update channel detection soft information, or to row code decoder 320, which may rely on such soft information in subsequent row code decoding operations. In addition, channel detector 310 may transfer updated channel detection soft information to either row code decoder 320 or column code decoder 330, which may then perform further row or column decoding on previously failed codewords.

In general, the joint decoding process may follow the arrows shown in FIG. 3 sequentially in any order, where soft information corresponding to one or more symbols in one more or codewords is updated at each block. To ensure the decoding process progresses forward, extrinsic information is passed from one block to another within the joint product code decoder 300. In one example, the joint decoding process is initiated at channel detector 310, continues through row code decoder 320 to decode all row codewords, then continues to column code decoder 330 to decode all column codewords. After all row codewords and all column codewords have been considered once, for any "failed" row or column codewords that were not decoded successfully, a retry may begin at channel detector 310. In one example, during retry, column decoder 330 may iterate with channel detector 310 for several rounds before soft information is provided to row code decoder 320. Row code decoder 320 may then iterate with either channel detector 310 or column detector 330 for several rounds, before soft information is transferred to the next block.

The scheduling between the three blocks may be pre-defined or dynamic. In some embodiments, syndrome weights computed by row code decoder 320 or column code decoder 330 may be used to determine whether channel detector 310 should be skipped in the next round. For example, if syndrome weights of most column codewords considered during column-decoding are low, joint decoder 300 may skip channel detector 310 and perform row-decoding as the next step. One reason for skipping channel detector 310 when syndrome weights for column (or row) codewords are low is that convergence of joint iterative decoding occurs at the decoder blocks only, and skipping channel detector block 310 may save processing power.

Figure 4:
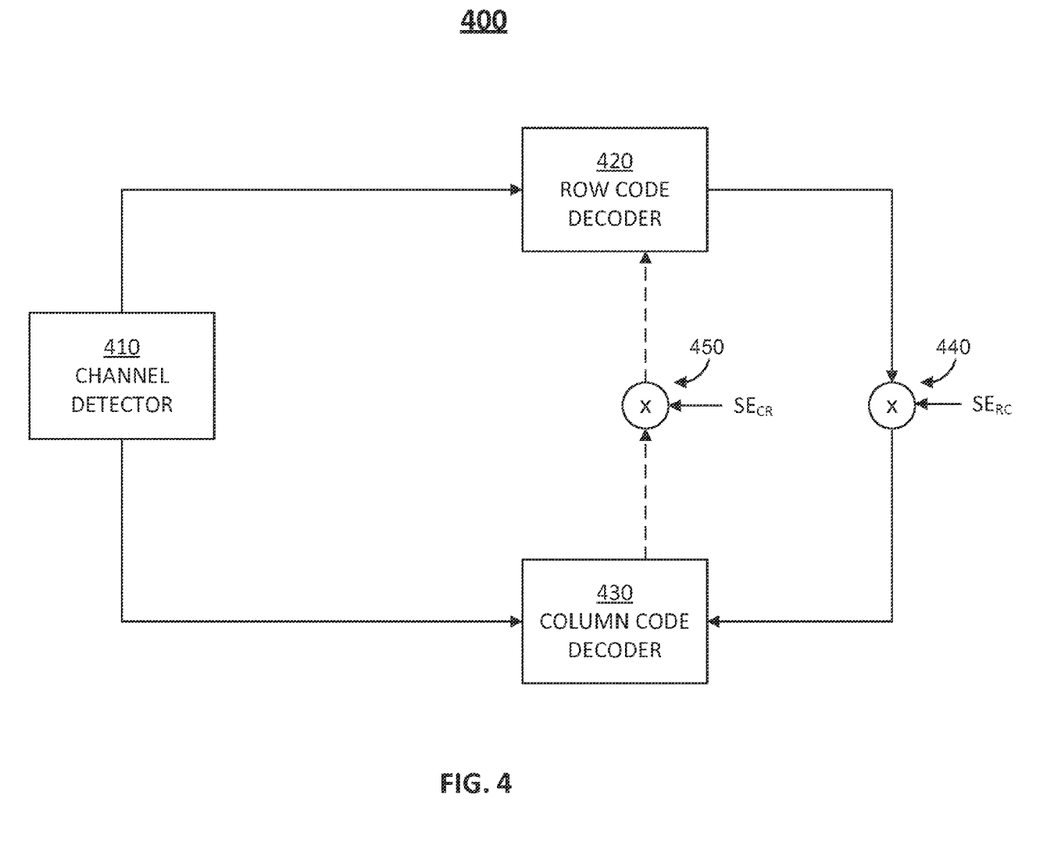

FIG. 4 shows a block diagram for a joint product code decoder 400 comprising a channel detector 410, a row code decoder 420, and a column code decoder 430. The channel detector 410, row decoder 420, and column decoder 430 are equivalent to and function similarly to the channel detector 310, row decoder 320, and column decoder 330 respectively in the joint product code decoder 300. In particular, FIR samples or soft information from channel detector 410 is provided to both the row code decoder 420 and the column code decoder 430. However, in contrast to joint product code decoder 300, in joint product code decoder 400, there are no additional iterations from either row code decoder 420 or column code decoder 430 to channel detector 410. Such joint decoding operations that do not iterate with the channel detector 410 may be desirable when the read channel is memoryless.

Each of the row code decoder 420 and column code decoder 430 may be a hard decoder or a soft decoder. If both are hard decoders, no soft information (e.g., extrinsic information) is passed between decoders 420 and 430. Iterations between decoders 420 and 430 may instead be viewed as a serial decoding process, where previously undecoded symbols in a row codeword are column decoded, and vice versa. For example, row decoder 420 may first decode a given number of row codewords, after which a given number of column codewords are decoded by column decoder 430, at least partially based on data symbols that have already been successfully decoded by row code decoder 420. After a given number of column codewords are decoded, row code decoder 420 may continue the row decoding process, to decode a next set of row codewords. The next set of row codewords may or may not include row codewords that have previously failed the row decoding process. Such iterations between row code decoding and column decoding may be repeated, until all user data are successfully decoded. In addition, symbols that are successfully decoded through row-decoding may be relied upon for computing column syndromes, and symbols successfully identified through column-decoding may be relied upon for computing row syndromes.

In addition, as in joint decoder 300, soft information such as extrinsic LLRs may be passed back and forth between row code decoder 420 and column code decoder 430. For example, when both the row code and the column code are LDPC codes, row decoder 420 and column decoder 430 are LDPC decoders, and the exchange of soft information between each LDPC decoder 420 and 430 may substantively improve the performance of the decoding process. Such soft information may be further scaled by scaling factors $SE_{CR}$ 450 when transferred from column code decoder 430 to row code decoder 420, and $SE_{RC}$ 440 when transferred from row code decoder 420 to column code decoder 420. For example, scaling factors $SE_{CR}$ 450 and $SE_{RC}$ 440 may be used to suppress an effect of soft information transferred from the column code decoder 430 to the row code decoder 420 and vice versa. Scaling factors such as $SE_{CR}$ 450 and $SE_{RC}$ 440 may vary from iteration to iteration, and may be updated depending on the range of the soft information, the number of undecoded codewords, full or target syndrome weights, or other relevant performance metric or system parameters. In the general joint decoder 300 shown in FIG. 3, soft information passed from any of the three blocks may be scaled in similar fashion.

Figure 5:
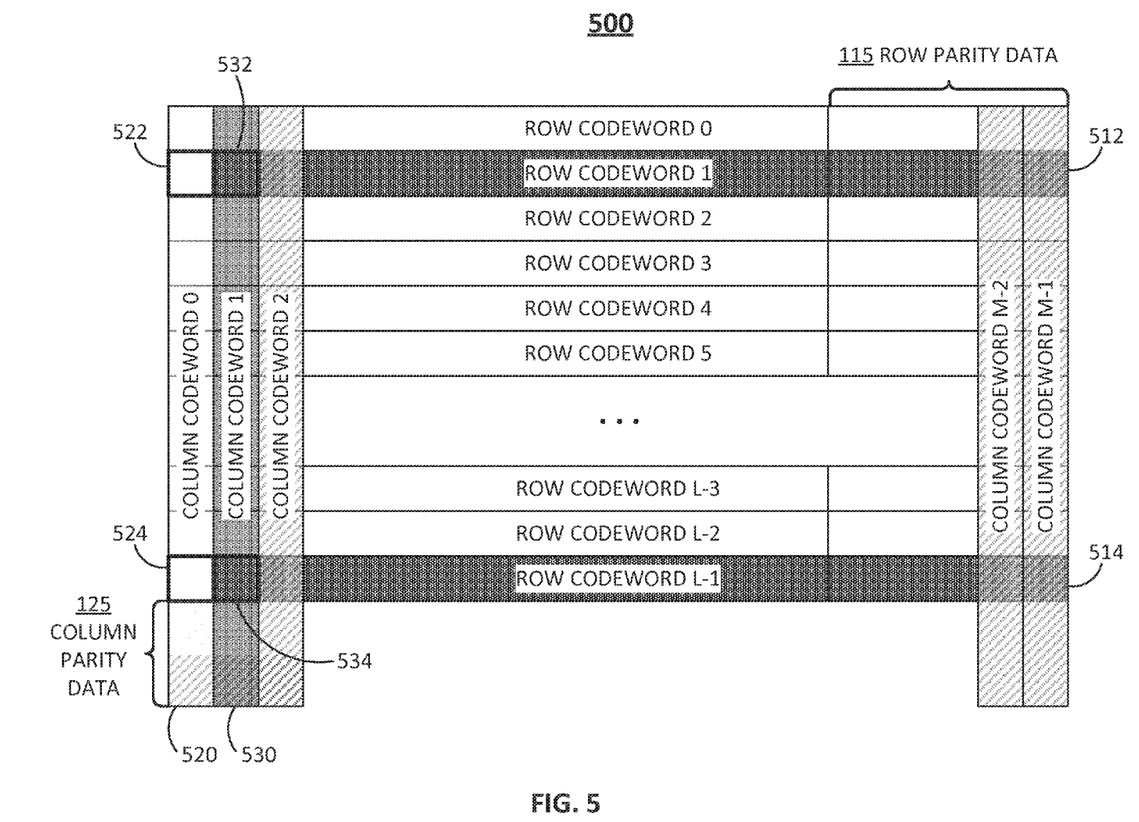
FIG. 5 shows a product code diagram of product code during an illustrative serial decoding process, in accordance with an embodiment of the present disclosure.

FIG. 5 shows a product code diagram 500 of an illustrative product code, during a serial decoding process performed by joint decoder 300 shown in FIG. 3, in accordance with an embodiment of the present disclosure. A serial decoding scheme is an example of the joint decoding process described in relation to FIGS. 3 and 4. In a global joint decoding round during serial decoding, at least one of the two decoders attempts to decode only a subset of codewords that the decoder has not successfully decoded in previous rounds of joint decoding. Decoding only a few instead of all remaining undecoded codewords before passing soft information to the next block in joint decoder 300 is advantageous in terms of storage, because the amount of soft information passed between blocks can be significantly reduced, especially when the length of a codeword is long in one or both dimensions.

In the example shown in FIG. 5, user data are encoded to generate row parity data 115 and column parity data 125, and joint decoding is performed by iterating between row decoder 320, column decoder 330, and optionally channel detector 310. Diagram 500 illustrates the state of the decoding process after all of row codewords have been processed by row decoder 320 once, while only a portion of column codewords have been processed by column decoder 330. Shaded row codewords (row codeword 0 (512) and row codeword L−1 (514)) denote row codewords that have failed the row decoding process, while unshaded row codewords denote those codewords that have been successfully decoded. Because row codewords 512 and 514 have failed to decode successfully, soft information corresponding to failed row codeword 512 and 514 is stored and transferred to column code decoder 330. In addition, symbols in successfully decoded row codewords may be used to partially compute target column syndromes for coset-based decoding. During serial decoding, instead of next decoding all column codewords, column decoder 330 performs local decoding on a subset of all column codewords, for example on the first two column codewords 520 and 530 only, based at least partially on soft information obtained from row code decoder 320. In an example, the column decoding of column codeword 520 is successful, while the column decoding of column codeword 530 fails. Thus, in this example, symbols 522 and 524 are successfully decoded and may be used to update the target syndrome of row codewords 512 and 514, while soft information corresponding to symbols 532 and 534 are updated during the column decoding process, and may be returned to channel detector 310 or row code decoder 320. In subsequent iterations, column code decoder 330 may attempt to decode one or more column codewords that contain symbols 532 or 534, before passing soft information to row decoder 330 or channel detector 310. The extrinsic data corresponding to overlapped symbols (e.g., symbol 532 contained in both row codeword 512 and column codeword 530) may be used as the a-priori data by the next block, where other non-overlapped symbols may initialize without a-priori information, or with LLRs computed from the last round of joint decoding.

With serial decoding, the storage of APP or extrinsic LLRs used in communication across the three decoding units is only m*(q/M) times the row codeword size instead of m times the row codeword size, where q is the number of column codewords for which soft information is passed to row code decoder 320 (or channel detector 310), m is the maximum anticipated number of failed row codewords, and M is the total number of column codewords.

In the example product code shown in FIG. 5, all of the row codewords have been processed by row code decoder 320 once, before column code decoder 330 attempts to decode one or more column codewords. In various embodiments, the iterations across the row decoding, column decoding, and channel detection may occur after only a portion of all row codewords are processed. For example, row code decoder 320 may attempt to decode an initial three row codewords only, before transferring soft information to column decoder 330 for the column decoding of the initial two column codewords. As another example, row code decoder 320 may attempt to decode a random or a particular subset of all of the row codewords, before transferring soft information to column decoder 330, and vice versa.

Figure 6:
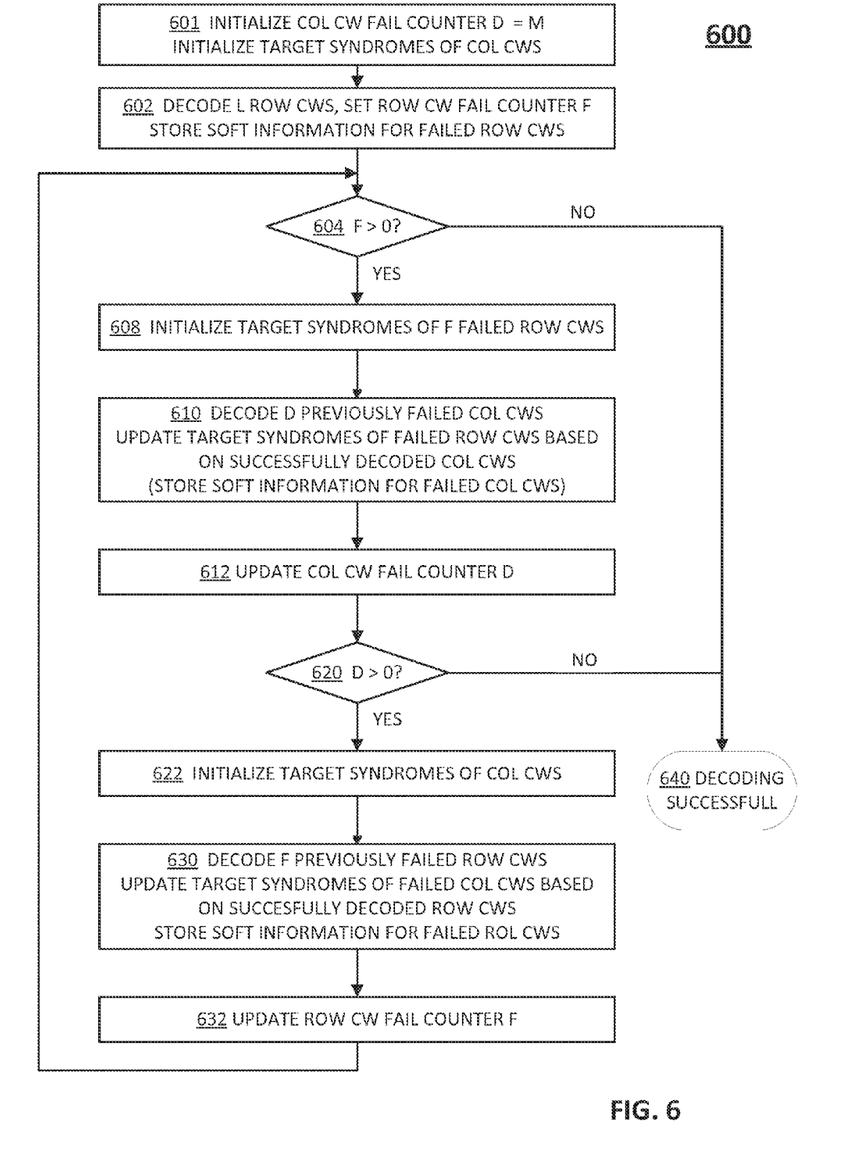
FIGS. 6 and 7 show flow diagrams of illustrative decoding processes, in accordance with some embodiments of the present disclosure.

FIG. 6 is a flow diagram of a process 600 for iteratively decoding user data encoded with a product code. In this illustrative example, row decoding is performed on all row codewords first. If any row codeword fails (i.e., cannot be decoded), column decoding is performed on all column codewords. The process of iterating between row decoding of previously failed row codewords and the column decoding of previously failed column codewords are repeated until all row codewords or all column codewords have been decoded successfully.

At 601, a column codeword fail counter D that identifies the number of undecoded or "failed" column codewords is initialized to M, where M is equal to the total number of column codewords in the product code. In addition, storage space is allocated for the storage of target syndromes of column codewords and are set to zero vectors.

Target syndromes represent partially or fully computed coset syndromes for corresponding codewords. In particular, as decoding progresses, "target syndromes" of row codewords and "target syndromes" of column codewords may be updated based on whether any of the decoding of the codewords has been successful or has failed. As used herein, a "target syndrome" refers to an expected syndrome when decoding is successful. The target syndrome is a zero vector for a successfully decoded codeword. In accordance with the present disclosure, the target syndrome in one dimension may be updated as successful decoding occurs in another dimension. In an example, a column codeword (such as column codeword 520) overlaps with a row codeword (such as row codeword 512) at one or more symbols (such as symbol 522). When row decoding of the row codeword is successful, the values for the one or more overlapping symbols are known, and the decoding of the column codeword may be simplified by removing the portion of the parity check matrix of the column codeword that corresponds to the known overlapping symbols. Removing this portion of the parity check matrix is referred to herein as "pruning" the parity check matrix. Furthermore, the target syndrome is accordingly updated to account for the pruning of the parity check matrix. As used herein, a "target syndrome" may also be referred to as a "partial syndrome" or a "coset syndrome."

At 602, the L row codewords are decoded, where the total number of row codewords that have failed is tallied by the row codeword fail counter F. For example, in the product code shown in FIG. 5, row codeword 512 and row code codeword 514 are shaded to represent row codeword decoding failures. In this example, F is equal to 2. During row-decoding, soft information such as LLRs may be updated for a given number of row-decoding message-passing iterations. The desirable number of iterations may be programmable and configured in real-time by the row-decoder, based on read channel noise characteristics, a syndrome weight threshold, and/or other relevant system parameters. LLRs computed for each symbol may be compared to a threshold to make symbol-level hard decisions. A row codeword thus determined may be passed through a syndrome decoder to determine whether the decoded data represents a valid row codeword. If the decoded data do not represent a valid row codeword, the row codeword is said to have failed the row-decoding process. For each failed row codeword, channel detector soft information such as detector LLRs are stored in memory. Optionally, extrinsic information such as extrinsic LLRs or APP LLRs computed by the row-decoder may be stored for failed row codewords. In the example shown in FIG. 5, soft information is stored for each symbol within the failed row codewords 512 and 514. Such soft information stored from the row-decoding process may later be passed to the column decoding process to improve the performance of the column decoding process.

At 604, the row codeword fail counter F is examined to determine whether F is greater than zero. In particular, if all row codewords have been decoded successfully, F is zero, and all the user data that was protected by the product code is deemed to have been recovered. In this case, process 600 proceeds to 640 to indicate that decoding of all the user data are successful. Otherwise, if it is determined at 604 that one or more row codewords have failed (i.e., that F is greater than zero), process 600 proceeds to 608 to allocate storage space and initialize target syndromes corresponding to the F failed row codewords to zero vectors. Target syndromes represent partially computed coset syndromes for corresponding codewords.

At 610, column codewords that have previously failed are decoded. During the first time that 610 is performed, the column codeword fail counter D is equal the total number of column words, which is set to M at process 601. This example may be illustrated by product code diagram 500 shown in FIG. 5 as well, in addition to the serial decoding example previously discussed. In the previous example, a subset of undecoded column codewords are considered by the column code decoder in each round of joint decoding. In this example, all of the undecoded column codewords are considered by the column code decoder in each round of joint decoding. In the current example, the column decoder is initialized with soft information corresponding to failed row codewords. For example, to decode column code word 520 in FIG. 5, the column-decoder may be initialized with soft information corresponding to failed symbols 522 and 524 received from the row-decoder. Such soft information may include channel detector LLRs or extrinsic LLRs computed by the row decoder. The column-decoder then performs localized message-passing steps and syndrome calculations to determine user data corresponding to each column codeword.

Depending on whether the column codewords are successfully decoded or not, the target syndromes of failed row codewords may be updated, or the soft information may be stored for the failed column codewords. In particular, when the decoding of a column codeword is successful, the target syndromes of the failed row codewords are updated. In an example, once symbol 522 in FIG. 5 is successfully decoded from column decoding, the target syndrome for previously failed row codeword 512 may be updated. However, for column codewords that have failed at 610, the soft information for the failed column codewords may be stored and later passed to the row-decoder as is described below in relation to 630.

At 612, the column codeword fail counter D is updated to reflect the remaining number of failed column codewords after the decoding at 610. At 620, the column codeword fail counter D is examined to determine whether all column codewords have been decoded successfully. If so (i.e., D is equal to zero), then this means that all user data protected by the product code is deemed to have been recovered, and the decoding process is declared successful at 640. However, if it is determined at 620 that one or more column codewords have failed (i.e., D is greater than zero), process 600 proceeds to 622 to reserve space and initialize target syndromes corresponding to the D failed column codewords to zero vectors, and the iterations between row decoding and column decoding continue to be performed at the decoder.

At 630, the F row codewords that have previously failed at 602 are attempted to be decoded again, based on the information that some symbols within each previously failed row codeword may have been successfully decoded through the column decoding process at 610. Alternatively, soft information corresponding to some symbols within the row codeword to be decoded again at 630 may have been updated as the result of 610. For example, if symbol 522 shown in FIG. 5 has been successfully decoded through the column decoding of column codeword 520 and has been used to update the partial parity of row codeword 512 (at 610), subsequent row decoding of row codeword 512 only needs to decode symbols other than symbol 522. In another example, if symbol 532 shown in FIG. 5 has not been successfully decoded since the column decoding of column codeword 530 has failed (at 610), soft information corresponding to symbol 532 may still be provided to the row-decoder for decoding row codeword 512. Furthermore, upon successful decoding of row codeword 512, target syndrome for the previously failed column codeword 530 may be updated based on successfully decoded symbol 532. On the other hand, if row codeword 514 is still not correctly decoded at 630, soft information corresponding to unsuccessfully decoded symbol 534 may be stored, for further use in the decoding of column codeword 530.

At 632, the row codeword fail counter F is updated to reflect the remaining number of failed row codewords after the attempted row decoding at 630. The process 600 then returns to 604, where the row codeword fail counter F is examined to determine whether all previously failed row codewords have been decoded successfully thus decoding can be declared successful. As shown in FIG. 6, the iterations between column decoding (described in relation to 610) and row decoding (described in relation to 630) continue to repeat until all row codewords or all column codewords have been successfully decoded.

Figure 7:
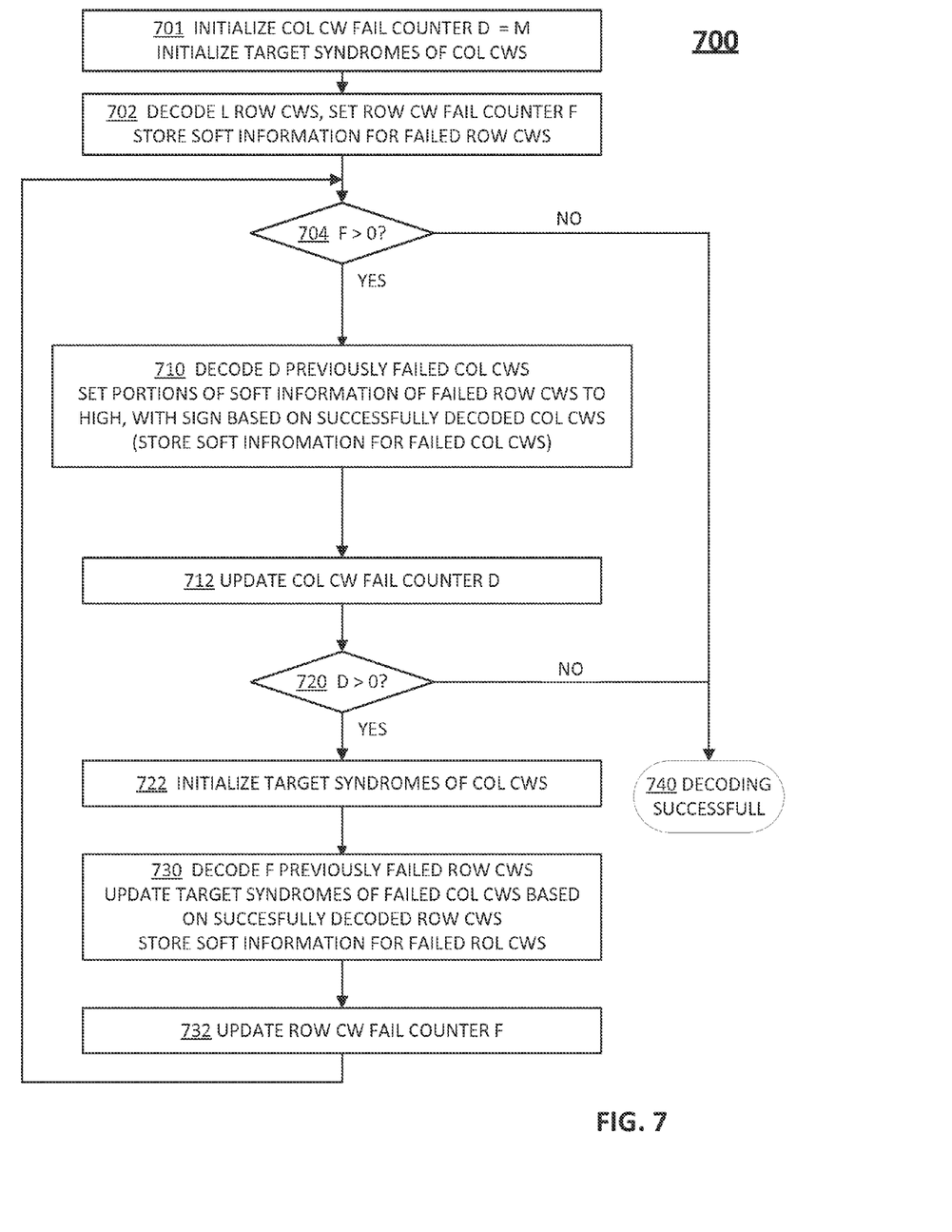

FIG. 7 is a flow diagram of a process 700 for iteratively decoding user data encoded with a product code. Process 700 is similar to process 600, except that in process 600, coset-based syndrome decoding is performed on both the row code and the column code, with target syndromes for both the row codewords and the column codewords computed, while in process 700, only regular decoding is performed on the row code, but coset-based syndrome decoding is also performed on the column code, with target syndromes computed for the column codewords only and not for the row codewords. In other words, pruning and coset syndrome computations/updates are performed on both the row code and the column code in process 600, while they are performed for the column code only in process 700.

Most of process 700 are equivalent to those shown in process 600, with the exception of 710. In particular, 710 of process 700 differs from 610 of process 600 in that when decoding of a column codeword is successful, the target syndromes of the failed row codewords are updated at 610. However, at 710, when the decoding of a column codeword is successful, the portions of soft information of the failed row codewords are set to a high predetermined value, with the sign of the predetermined value based on the successfully decoded column codeword. In particular, the high predetermined value may be a maximum LLR value, and the sign of the LLR value corresponds to the corresponding decoded value. The remainder of 710 is similar to 610 of process 600.

Figure 8:
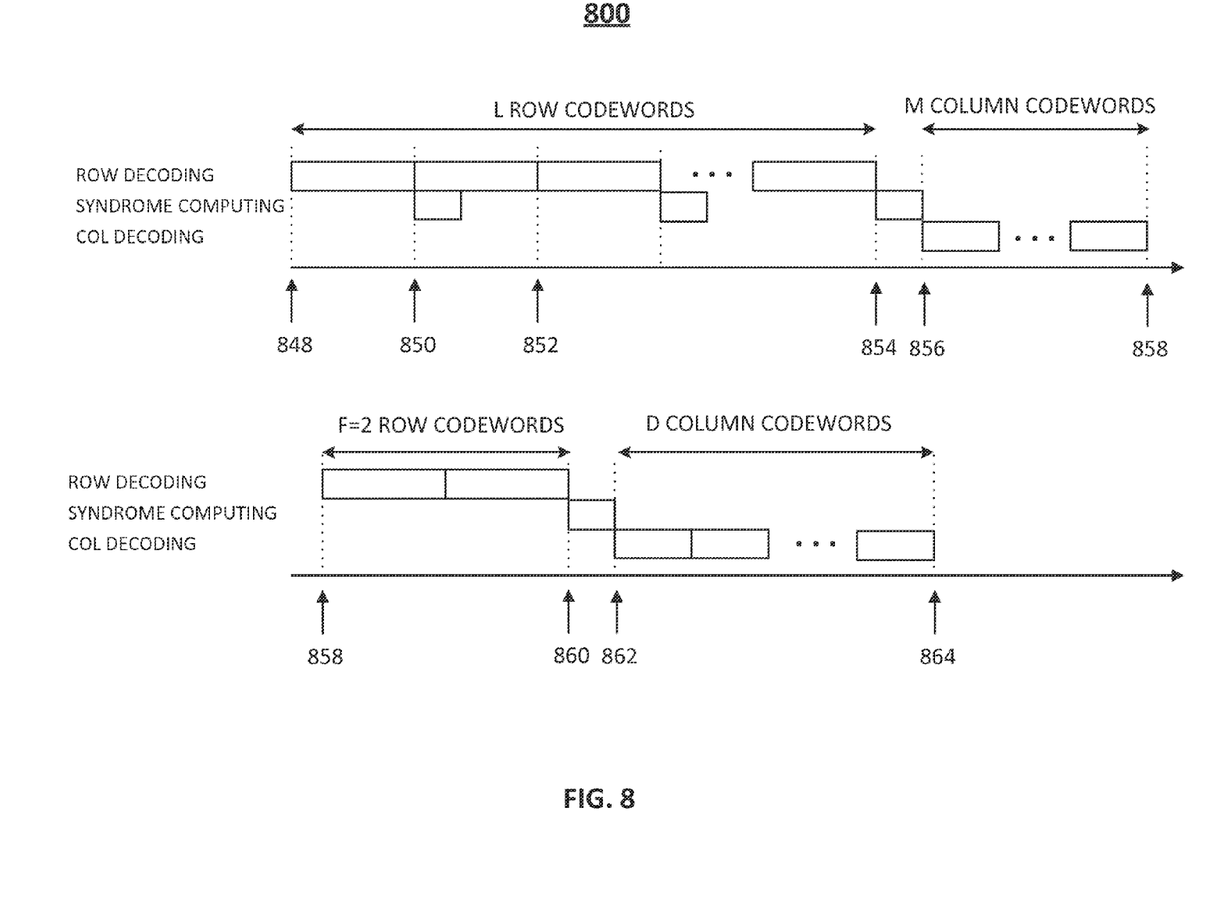
FIG. 8 show an illustrative timing diagram of an illustrative decoding process, in accordance with an embodiment of the present disclosure.

FIG. 8 is a graphical illustration of a timing diagram 800 for decoding user data using a product code. In particular, diagram 800 includes three sets of rectangles along a time axis that indicate the various time intervals during which row decoding (top), syndrome computing (middle), and column decoding (bottom) take place. In particular, timing diagram 800 shows that syndrome computing takes place during the decoding of the row codewords. As described herein, syndrome computing refers to target or partial syndrome computing, where a syndrome is partially computed from symbols that have already been detected. As described in detail in relation to FIG. 6, target syndrome computing includes progressively updating the syndrome of column codewords during row decoding, or progressively updating the syndrome of row codewords during column decoding. If the decoding of a row codeword is successful, the hard decisions of the decoding may be used to update current values of the target syndromes of the column codewords. As row decoding is completed, the column syndrome computations are also completed and are used to correct errors in column codewords.

In particular, timing diagram 800 includes four main time intervals. Each main time interval includes the attempted decoding of a set of remaining row codewords or a set of remaining column codewords. In particular, a first main time interval (between times 848 and 854) includes the attempted decoding of L row codewords, and a second main time interval (between times 856 and 858) includes the attempted decoding of M column codewords. During these initial two main time intervals, the decoding of one or more codewords may fail. In this case, a third main time interval (between times 858 and 860) depicts the attempted decoding of F row codewords, where F corresponds to the number of row codewords that failed to successfully be decoded during the first main time interval. In addition, a fourth main time interval (between times 862 and 864) includes the attempted decoding of D column codewords, where D corresponds to the number of column codewords that failed to be successfully decoded during the second main time interval.

During the first main time interval, a decoder attempts to decode all L row codewords. During the decoding of the L row codewords, target syndromes for the M column codewords are computed or updated when the decoding of a row codeword is successful. In an example, the decoding of row codeword 0 takes place in the time interval immediately preceding time 850. When the decoding of row codeword 0 is successful, the target syndromes for all M column codewords are updated starting at time 850. In particular, the hard decisions resulting from the successful decoding of the row codeword 0 is used to update the current values of the target syndromes of the column codewords. However, if the decoding of a row codeword fails, the target syndromes for the column codewords are not updated. For example, the decoding of row codeword 1 takes place in the time interval between times 850 and 852. The row decoding of row codeword 1 fails, such that no updating of the target syndromes is performed at time 852.

At time 854, each of the L row codewords have been attempted to be decoded. When decoding of row codeword L−1 is successful, the target syndromes for all M column codewords are updated at time 854, and the M column codewords are attempted to be decoded during the second main time interval (that starts at time 856 and ends at time 858). After the M column codewords have been attempted to be decoded, the decoding process returns to decode the F (out of L) row codewords that failed to successfully be decoded during the first main time interval. During the decoding of the F row codewords, the LLR values are improved or updated by taking into account the extrinsic information that were computed during the column decoding process. In the example shown in FIG. 8, the decoding of one of the two row codewords (the second row codeword) is successful, and the decoding of the other of the two row codewords (the first row codeword) fails.

Because one of the row codewords failed in the third main time interval, the remaining column codewords (the D column codewords that have not yet been successfully decoded) are re-attempted to be decoded during the fourth main time interval between times 862 and 864. The decoding time per column codeword for the fourth main time interval is likely shorter than the decoding time per column codeword for the first main time interval. This is because many of the row codewords have been successfully decoded, such that the corresponding portions of the parity check matrix (corresponding to the successful row codewords) of the parity check matrix for the column code have been pruned or removed.

Figure 9:
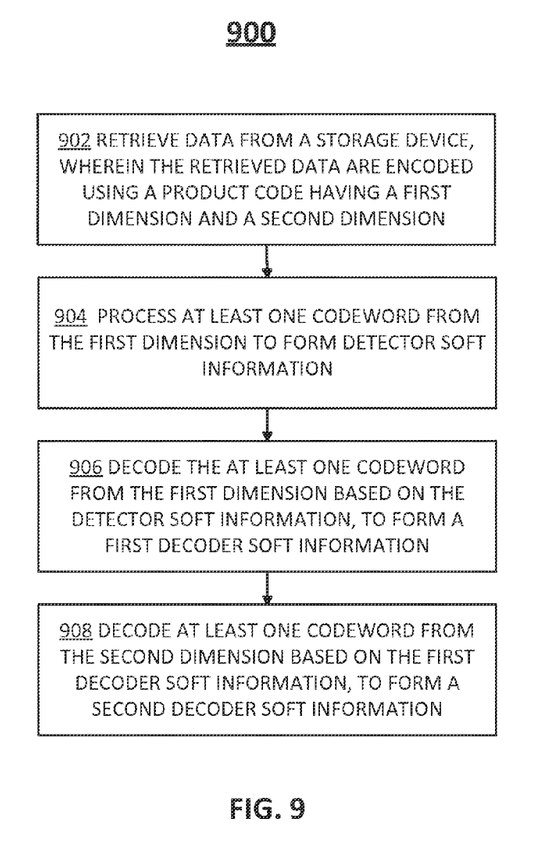
FIG. 9 shows a flow diagram of a high level process for decoding data encoded with a product code, in accordance with an embodiment of the present disclosure.

FIG. 9 is a high level flow diagram of a process 900 for decoding data stored on a storage device using a product code having a first dimension and a second dimension. Process 900 may be implemented by a joint channel detection and product code decoding circuitry to decode a set of user data. The storage device may be non-volatile, and may be a magnetic storage device.

At 902, data previously written to a storage device is retrieved. For example, a read-head may be controlled by a control circuitry to obtain a front end read-signal, and the read-signal may be processed by analog and digital circuitries to obtain and buffer a set of digitized channel detection information representative of the data being retrieved. The retrieved data may correspond a plurality of sectors and may have been written to one of a plurality of tracks using a shingled technique. The retrieved data are encoded using a product code having a first dimension and a second dimension. When the first dimension is a row dimension, the retrieved data may correspond to row user data 110 shown in FIG. 1. The retrieved data may be buffered upon retrieval.

At 904, a portion of the retrieved data corresponding to at least one codeword from the first dimension is processed to form detector soft information. For example, the first codeword from the first dimension may correspond to row codeword 0 shown in FIG. 1, where the row code is the code operating in the direction of the user data as the data are sequentially read from the n storage device. In some embodiments, the at least one codeword from the first dimension is processed by a channel detector such as a soft output Viterbi detector to form detector soft information, where soft information between adjacent or nearby symbols in the codeword are exchanged and updated through a messaging passing algorithm for a given number of iterations.

At 906, the at least one codeword from the first dimension is decoded based on the detector soft information, to form a first decoder soft information. For example, when the first row codeword is encoded in a block error correction code such as an LDPC code, a message passing algorithm may be performed on graph 290 shown in FIG. 2 to determine user data corresponding to the row codeword, where the message passing algorithm is initialized with channel detector soft information formed in 904. When the decoding of a row codeword fails, soft information computed during the decoding process may be stored for later use in column decoding, in accordance with the iterative decoding example process shown in FIG. 5.

At 908, at least one codeword from the second dimension is decoded based on the first decoder soft information, to form a second decoder soft information. For example, when the at least one codeword is a column codeword encoded in a block error correction code, in accordance with the product code shown in FIG. 1, a message passing algorithm may be performed on a Tanner graph such as graph 295 shown in FIG. 2 to determine user data corresponding to the column codeword, based at least partially on soft information previously calculated during the row-decoding process in 906. When the decoding of the column codeword fails, soft information computed during the decoding process may be stored for later use in subsequent row decoding, in according with the iterative decoding example process shown in FIG. 5.

The foregoing describes methods and systems for jointly decoding user data using product codes for storing data to a non-volatile storage device. The above-described embodiments of the present disclosure are presented for the purposes of illustration and not of limitation. Furthermore, the present disclosure is not limited to a particular implementation. For example, one or more steps of methods described above may be performed in a different order (or concurrently) and still achieve desirable results. In addition, the disclosure may be implemented in hardware, such as on an application-specific integrated circuit (ASIC) or on a field-programmable gate array (FPGA). The disclosure may also be implemented in software.

What is claimed is:

1. A method for decoding data stored on a storage device, comprising:
    retrieving data from the storage device, wherein the retrieved data are encoded using a product code having a first dimension and a second dimension;
    processing at least one codeword from the first dimension to form detector soft information;
    decoding the at least one codeword from the first dimension based on the detector soft information, to form a first decoder soft information;
    decoding at least one codeword from the second dimension based on the first decoder soft information, to form a second decoder soft information; and
    updating the detector soft information based on the second decoder soft information in response to determining that a target syndrome weight of one of the at least one codeword from the second dimension exceeds a predetermined threshold.

2. The method of claim 1, further comprising updating the first decoder soft information based on the second decoder soft information.

3. The method of claim 2, further comprising scaling the second decoder soft information.

4. The method of claim 1, further comprising updating the second decoder soft information based on the detector soft information.

5. The method of claim 1, wherein the storage device is a magnetic storage device.

6. The method of claim 1, wherein the retrieved encoded data are written to one of a plurality of tracks using a shingled technique.

7. The method of claim 1, wherein processing the at least one codeword from the first dimension comprises performing finite impulse response (FIR) filtering operations.

8. The method of claim 1, wherein the data are retrieved from a plurality of sectors of the storage device.

9. A decoder for decoding data stored on a storage device, the decoder comprising circuitry configured to:
    retrieve data from the storage device, wherein the retrieved data are encoded using a product code having a first dimension and a second dimension;
    process at least one codeword from the first dimension to form detector soft information;
    decode the at least one codeword from the first dimension based on the detector soft information, to form a first decoder soft information;
    decode at least one codeword from the second dimension based on the first decoder soft information, to form a second decoder soft information; and update the detector soft information based on the second decoder soft information in response to determining that a target syndrome weight of one of the at least one codeword from the second dimension exceeds a predetermined threshold.

10. The decoder of claim 9, wherein the circuitry is further configured to update the first decoder soft information based on the second decoder soft information.

11. The decoder of claim 10, wherein the circuitry is further configured to scale the second decoder soft information.

12. The decoder of claim 9, wherein the circuitry is further configured to update the second decoder soft information based on the detector soft information.

13. The decoder of claim 9, wherein the storage device is a magnetic storage device.

14. The decoder of claim 9, wherein the retrieved encoded data are written to one of a plurality of tracks using a shingled technique.

15. The decoder of claim 9, wherein the circuitry is configured to process the at least one codeword from the first dimension by performing finite impulses response (FIR) filtering operations.

16. The decoder of claim 9, wherein the data are retrieved from a plurality of sectors of the storage device.

* * * * *